United States Patent
Duzevik et al.

(10) Patent No.: US 7,071,739 B1
(45) Date of Patent: Jul. 4, 2006

(54) TERMINATION SENSE-AND-MATCH DIFFERENTIAL DRIVER

(75) Inventors: Ivan Duzevik, Portland, ME (US); Steven Mark Macaluso, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/755,011

(22) Filed: Jan. 8, 2004

(51) Int. Cl.
   *H03K 3/00*  (2006.01)
(52) U.S. Cl. .......................................... 327/108; 326/30
(58) Field of Classification Search ........ 327/108–112, 327/434, 436, 437; 326/30, 82, 83
   See application file for complete search history.

(56) References Cited

U.S. PATENT DOCUMENTS

| | | | |
|---|---|---|---|
| 3,602,832 A * | 8/1971 | Raymond | 330/86 |
| 6,356,141 B1 * | 3/2002 | Yamauchi | 327/543 |
| 6,369,621 B1 * | 4/2002 | Tinsley et al. | 327/108 |
| 6,380,797 B1 | 4/2002 | Macaluso | |
| 6,570,931 B1 * | 5/2003 | Song | 375/295 |
| 6,600,346 B1 * | 7/2003 | Macaluso | 327/108 |
| 6,603,348 B1 * | 8/2003 | Preuss et al. | 327/563 |
| 6,756,812 B1 * | 6/2004 | Nagano et al. | 326/60 |
| 6,853,253 B1 * | 2/2005 | Desortiaux | 331/16 |

\* cited by examiner

*Primary Examiner*—Kenneth B. Wells
(74) *Attorney, Agent, or Firm*—Darby & Darby PC; Matthew M. Gaffney

(57) ABSTRACT

A differential driver circuit is configured to automatically adjust its source resistance to be substantially similar to a termination resistance. The differential driver circuit includes a variable resistance circuit on each leg of the differential driver circuit. A replica of one leg of the differential driver circuit is configured for adjusting the variable resistance circuits so that the differential driver circuit's source resistance appears to a load as substantially similar to the termination resistance.

20 Claims, 4 Drawing Sheets

$VINN\ (-\smile-)\ AND\ VINP\ (-\frown-) = VIN$

US 7,071,739 B1

TERMINATION SENSE-AND-MATCH DIFFERENTIAL DRIVER

FIELD OF THE INVENTION

The invention is related to differential drivers, and, in particular, to an apparatus for matching a source resistance of a differential driver to a termination resistance.

BACKGROUND OF THE INVENTION

Typically, a low-voltage differential signaling (LVDS) interface uses a differential input to generate a differential output signal without using a reference voltage. Also, LVDS interfaces often use two conductors to carry a differential signal. Some uses of LVDS interfaces include multi-gigabit data transfers on copper interconnects and high speed transmission lines. Also, LVDS interfaces may be used with point-to-point applications such as those employed in telecommunications, data communications, and video displays.

BRIEF DESCRIPTION OF THE DRAWINGS

Non-limiting and non-exhaustive embodiments of the present invention are described with reference to the following drawings, in which.

DETAILED DESCRIPTION

Figure 1:
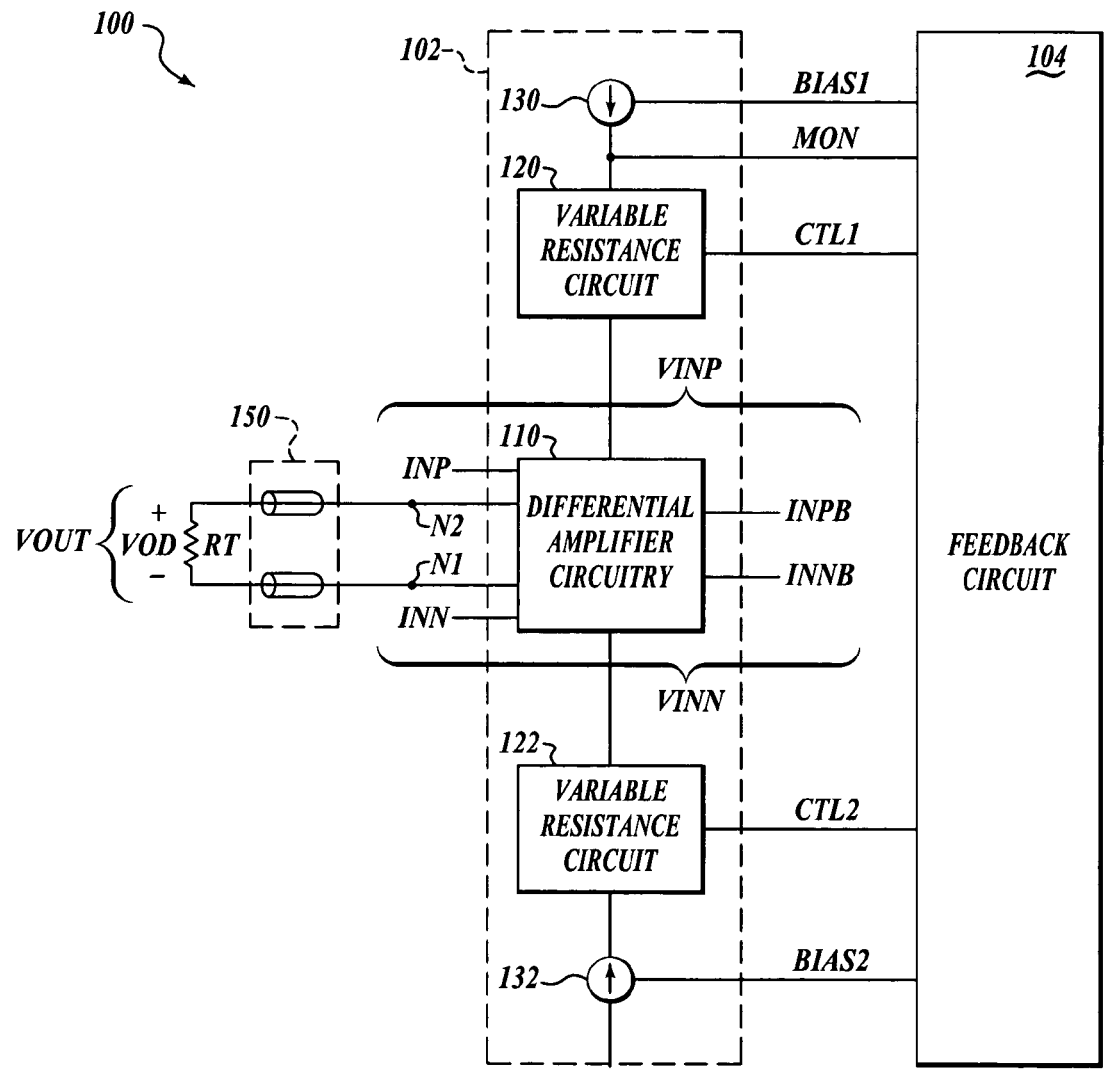
FIG. 1 shows a block diagram of a differential driver circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, a differential driver circuit is configured to automatically adjust its source resistance to be substantially similar to a termination resistance. The differential driver circuit includes a variable resistance circuit on each leg of the differential driver circuit. A replica of one leg of the differential driver circuit is configured for adjusting the variable resistance circuits so that the differential driver circuit's source resistance appears to a load as substantially similar to the termination resistance. Embodiments that can employ the invention include LVDS interfaces and Ethernet transmission line applications.

FIG. 1 shows a block diagram of a differential driver circuit (100) that can be configured to operate at relatively low voltages, e.g. 1 volt or less in an LVDS interface. However, this inventive differential driver circuit is not limited to LVDS interfaces or other interfaces that operate at substantially the same voltages. Instead, the invention may be employed with other interfaces that operate at substantially higher or lower voltages.

Differential driver circuit 100 includes an output driver circuit (102), a feedback circuit (104), a pair of transmission lines (150), and a termination resistor (Rt). Output driver circuit 102 includes differential amplifier circuitry (110), a first variable resistance circuit (120), a second variable resistance circuit (122), a first current source circuit (130), and a first current sink circuit (132). Variable resistance circuits 120 and 122 are coupled to differential amplifier circuitry 110 and feedback circuit 104. Current source circuit 130 is coupled to feedback circuit 104 and variable resistance circuit 120. Current sink circuit 132 is coupled to feedback circuit 104 and variable resistance circuit 122.

Differential driver circuit 100 is configured to receive a differential input signal (Vin) having a primary ("positive") differential signal phase (Vinp) and an inverse ("negative") differential signal phase (Vinn). Primary differential phase Vinp includes signals INP and INPB. Inverse differential phase Vinn includes signals INN and INNB. Differential driver circuit 100 is configured to convert signal Vin to a differential output signal (Vout) having a peak-to-peak differential signal amplitude (VOD) and an offset voltage (Vos). The VOD drives a termination resistor (Rt) that is coupled to differential amplifier circuitry 110 via a pair of transmission lines 150. Resistor Rt has an associated termination resistance. Differential driver circuit 100 is configured to provide a VOD such that the VOD is relatively constant regardless of variations of process, supply voltage, temperature, and load. As illustrated in FIG. 1, signal Vin may be a dual differential signal with four signal components (INN, INNB, INP and INPB). However, in another embodiment, signal Vin may be provided as a single differential input signal with two signal components so that the invention operates in substantially the same manner.

Variable resistance circuit 120 is configured to vary an associated resistance in response to a first control signal (CTL1). Similarly, variable resistance circuit 122 is configured to vary an associated resistance in response to a second control signal (CTL2). Also, current source circuit 130 is configured to receive a first bias signal (Bias1), and current sink circuit 132 is configured to receive a second bias signal (Bias2). Output driver circuit 102 is further arranged to provide a driver monitor signal (Mon).

Feedback circuit 104 includes a scaled replica of a leg of output driver circuit 102. Feedback circuit 104 is also configured to perform various actions, including monitoring signal Mon, and providing bias signals Bias1 and Bias2. Feedback circuit 104 is further configured to control signals Bias1 and Bias2 in response to signal Mon such that output driver circuit 102 exhibits relatively reduced sensitivity to variations in process, voltage, and temperature variations.

Feedback circuit 104 is further configured to provide signals CTL1 and CTL2 to adjust variable resistance circuits 120 and 122, respectively, such that a source resistance of output driver 102 appears to be substantially similar to the termination resistance. This way, reflection may be substantially reduced or eliminated on transmission lines 150. Accordingly, line drive capability and noise immunity may be substantially improved.

Figure 2:
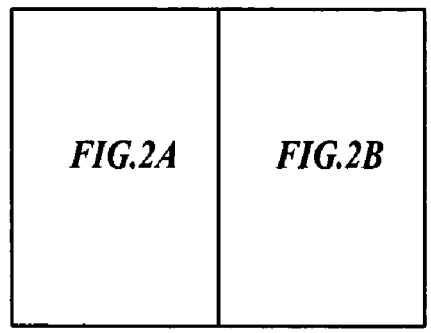
FIG. 2 schematically illustrates an implementation of the differential driver circuit of FIG. 1, in accordance with the present invention.
Figure 2A:
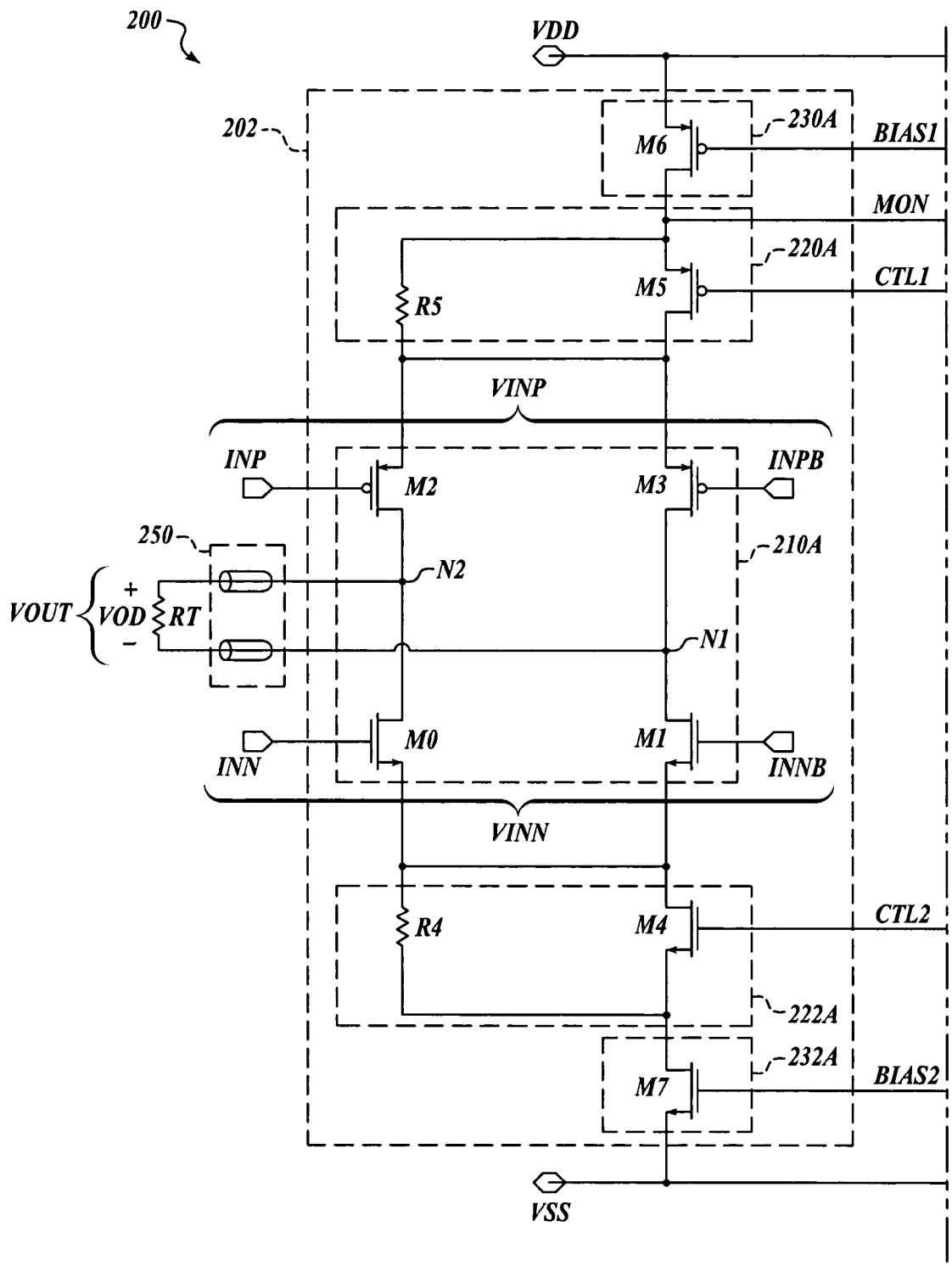
Figure 2B:
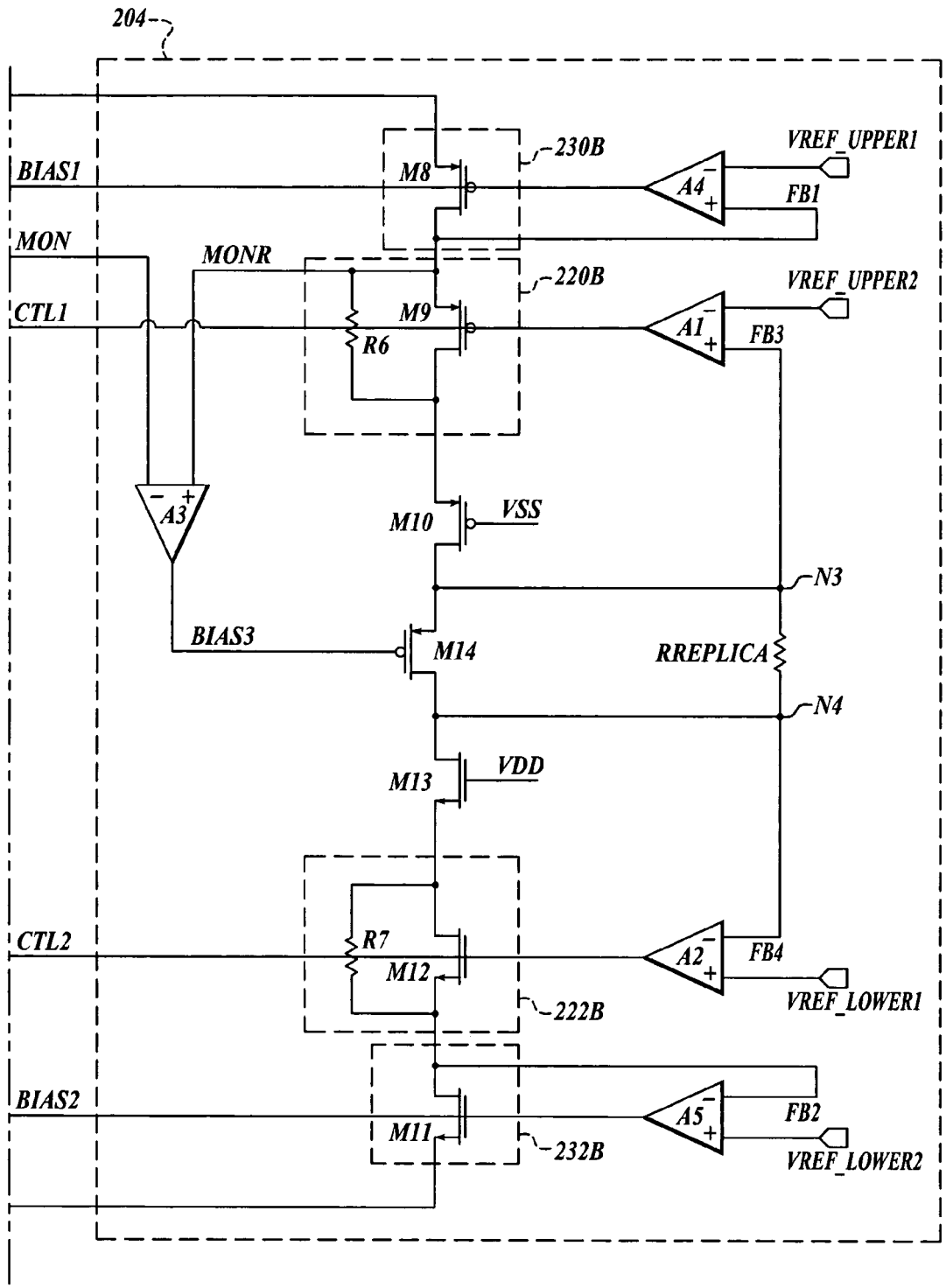

FIG. 2 schematically illustrates differential driver circuit 200. The arrangement of differential driver circuit 200 is substantially similar to differential driver circuit 100 in some ways, albeit different in other ways. Differential driver circuit 200 includes differential amplifier circuitry 210, variable resistance circuit 220, variable resistance circuit 222, and feedback circuit 204. Further, differential amplifier circuit 210 includes transistors (M0–M3); variable resistance circuit 220 includes a transistor (M5) and a resistor (R5); and variable resistance circuit 222 includes another transistor (M4) and another resistor (R4). Feedback circuit 204 includes a third variable resistance circuit (220B), a fourth variable resistance circuit (222B), transistors (M10, M13, and M14), a replica resistor (Rreplica), a second current source circuit (230B), a second current sink circuit (232B), and operational amplifiers circuits (A1–A5). Current source circuit 230B includes transistor M8 and current sink circuit 232B includes transistor M11. Variable resistance circuit 220 includes transistor M9 and resistor R6. Also, variable resistance circuit 222 includes transistor M12 and resistor R7.

Transistor M3 is coupled between variable resistance circuit 220A and a first output node (N1). Transistor M2 is coupled between variable resistance circuit 220A and a second output node (N2). Transistor M0 is coupled between variable resistance circuit 222A and node N1. Transistor M1 is coupled between variable resistance circuit 222A and node N2. Transistor M4 includes a drain that is coupled to differential amplifier circuitry 210A and a gate that is coupled to feedback circuit 204. Resistor R4 is coupled in parallel with transistor M4. Transistor M5 includes a drain that is coupled to differential amplifier circuitry 210A and a gate that is coupled to feedback circuit 204.

Operational amplifier circuit A1 is coupled between transistor M14 and variable resistance circuit 220B. Operational amplifier circuit A2 is coupled between transistor M14 and variable resistance circuit 222B. Variable resistance circuit 220B is coupled to variable resistance circuit 220A. Transistor M14 is coupled between a first feedback node (N3) and a second feedback node (N4). Resistor Rreplica is coupled in parallel with transistor M14. Operational amplifier circuit A3 is coupled to variable resistance circuit 220A, variable resistance circuit 220B, and transistor M14.

Transistors M0–M3 are arranged to operate as an output signal "switchbox" with differential pair transistors M3 and M2 receiving primary differential phase Vinp and differential pair transistors M1 and M0 receiving inverse differential phase Vinn of signal Vin. The interconnected drain terminals of transistors of M3 and M1 and transistors M0 and M2 substantially contribute to providing the VOD. When transistors M1 and M2 are turned on, transistors M3 and M0 are turned off. Conversely, when transistors M3 and M0 are turned on, transistors M1 and M2 are turned off. Accordingly, an output current (Iout) is steered through resistor Rt to provide the VOD for Vout.

As illustrated in FIG. 2, the output signal switchbox can be implemented in a complementary arrangement of P-MOSFET and N-MOSFET devices. In another embodiment, the output signal switchbox can be implemented using all P-MOSFET or all N-MOSFET devices.

As illustrated in FIG. 2, differential input signal Vin may be a dual differential signal. Alternatively, differential input signal Vin may be a single differential input signal with two components. In this case for the complementary arrangement of P- and N-MOSFETs illustrated in FIG. 2, the gate terminals of transistors M0 and M2 would be driven together by one component of the single differential input signal and the gate terminals of transistors M1 and M2 would be driven together by the other component of this signal.

Variable resistance circuit 220B is a replica of variable resistance circuit 220A. Variable resistance circuit 222B is a replica of variable resistance circuit 222A. Current source circuit 230B is a replica of current source circuit 230A. Current sink circuit 232B is a replica of current sink circuit 232A.

Transistors M6 and M7 are configured as a current source (230A) and a current sink (232A), respectively, for current Iout. Transistor M6 is arranged to be biased by signal Bias1 and transistor M7 is arranged to be biased by signal Bias2 which maintains current Iout in such a manner as to establish and maintain signal Mon at the interconnect between transistors M5 and M6.

Transistor M8 is configured as a current source (230B) that is controlled by signal Bias 1. Similarly, transistor M11 is configured as a current sink (232B) that is controlled by signal Bias2. Transistors M10 and M13, with their respective gate terminals biased at power supply rails VSS and VDD, respectively, are biased in their fully on states. Resistor Rreplica and transistor M14 are configured to emulate resistor Rt by providing a total (parallel) resistance that is substantially similar to the termination resistance.

Operational amplifier circuit A3 is configured to provide a third bias signal (Bias3) to modulate transistor M14 such that current source circuit 230A and current source circuit 230B each provide an approximately constant current. Signal bias3 controls, or modulates, an on-resistance of transistor M4. In turn, this controls, or modulates a replica current (Irep) through feedback circuit 204. Further in turn, this controls, or modulates, a monitor replica signal (Monr) at the interconnect of transistors M8 and M9. Operational amplifier circuit A3 is arranged to compare signals Mon and Monr. In one embodiment, signal Mon could appear between transistors M4 and M7 and a corresponding signal Monr could be presented at the interconnect of transistors M11 and M12. Also, operational amplifier circuit A3 could monitor these voltages and provide signal Bias3 in a substantially similar manner.

Operational amplifier circuit A3 is arranged to adjust signal Bias3 to cause signals Mon and Monr to be substantially equivalent. As a result, the drain-to-source voltages Vds, as well as the gate-to-source voltages Vgs (due to signal Bias1), of current source transistors M8 and M6 are also substantially equivalent. Accordingly, the currents Irep and Iout sourced by these transistors M8 and M6, respectively, are maintained at respective values that are determined by the relative sizes (e.g., channel widths) of transistors M8 and M6. For example, if transistors M8 and M6 are of equal size, then currents Irep and current Iout are equal. However, if transistor M6 is larger than transistor M8 by a factor of 10 then the ratio of current Iout to current Irep is Iout:Irep=10:1.

Virtually any scaling factor can be selected, depending upon the desired Irep and Iout currents. Also, depending upon the desired scaling factor, such a scaling factor will be common with respect to the ratios of the sizes of the various transistors as follows: transistors M8 and M6; transistors M10, M3 and M2; transistors M13, M1 and M0; transistors M11 and M7; transistors M9 and M5; and transistors M12 and M4.

In accordance with this scaling factor, since the transistor stack of output driver circuit 202 and the transistor stack of feedback circuit 204 are substantially equivalent in terms of device count between the power supply rails of VDD and VSS, the respective voltages dropped across these devices will be substantially equivalent. For example, the drain-to-source voltages across transistors M8 and M6 will be substantially equal, as will the drain-to-source voltages across transistors M11 and M7, transistors M10, M3 and M2, and transistors M13, M1 and M0. Additionally, a replica voltage (Vrep) across transistor M14 will be substantially equivalent to the VOD. Also, Vrep can be changed by selection of a first upper reference signal (VREF_UPPER1) and a first lower reference signal (VREF_LOWER2).

Operational amplifier circuit A4 is configured to bias current source circuits 230A and 230B in response to signal VREF_UPPER1 and a first feedback signal (FB1). Operational amplifier circuit A5 is configured to bias current sink circuits 232A and 232B in response to signal VREF_LOWER2 and a second feedback signal (FB2). Operational amplifier circuit A4 is configured to receive and compare signal VREF_UPPER1 and signal FB1 to provide signal Bias1 for transistors M8 and M6. Similarly, operational amplifier circuit A5 is configured to receive and compare signal VREF_LOWER2 and signal FB2 to provide signal Bias2 to transistors M11 and M7. If signal FB1 or FB2 increases (e.g., due to an increase in the replica current Irep) then signal Bias1 or Bias2, respectively, also increases. Conversely, if signals FB1 or FB2 decrease, then the corresponding signal Bias 1,Bias2 also decreases. As a result, currents Iout and Irep are maintained at the values necessary to, in turn, maintain the VOD at the value established by the controlling transistor M14.

Variable resistance circuit 220B is configured to vary an associated resistance in response to signal CTL1. Also, variable resistance circuit 222B is configured to vary an associated resistance in response to signal CTL2. Operational amplifier circuit A1 is configured to provide signal CTL1 in response to a third feedback signal (FB3) that is received at node N3 and a second upper reference signal (VREF_UPPER2). Operational amplifier circuit A2 is configured to provide signal CTL2 in response to a fourth feedback signal (FB4) that is received at node N4 and a second lower reference signal (VREF_LOWER1).

If transistors M1 and M2 are switched on, current Iout flows from M6 through M5, M2, goes through the termination resistor Rt, and then proceeds through transistors M1, M4, and M7. Output driver circuit 200 is configured such that the source resistance is substantially equivalent to the load resistance. Since output driver circuit 200 is differential, each leg of output driver circuit 200 has a leg source resistance that is substantially similar to one-half of the termination resistance. The source resistance of one of the legs is substantially similar to the sum of the on-resistance associated with transistor M1 and the resistance associated with variable resistance circuit 222A. The source resistance of the other leg is equal to the sum of the on-resistance associated with transistor M2 and the resistance associated with variable resistance circuit 220A.

Transistors M4, M5, M9, and M12 are each configured to operate in the linear region of operation. The resistance associated with variable resistance 222A is substantially similar to the on-resistance associated with transistor M4 in parallel with the resistance associated with resistor R4. The resistance associated with variable resistance circuit 220A is substantially similar to on-resistance associated with transistor M5 in parallel with the resistance associated with resistor R5. Resistors R4 and R5 are optional circuit elements that need not be included in differential driver circuit 200. If resistor R4 and R5 are not included, the resistance associated with variable resistance 222A is substantially similar to the on-resistance associated with transistor M4, and the resistance associated with variable resistance circuit 220A is substantially similar to the on-resistance associated with transistor M5.

If the termination resistance changes, the current Iout remains relatively constant and the VOD changes relative to the termination resistance change. The resistance associated with resistor Rreplica substantially mimics output driver circuit 202 and resistor Rt. Operational amplifier circuit A1 is configured to keep the drain-source voltages (Vds) and gate-source voltages (Vgs) of transistors M6 and M8 substantially constant. Accordingly, the voltage across resistor Rreplica returns to its previous value, bringing VOD back to the same value. Accordingly, the on-resistances associated with transistors M4 and M5 are modulated with operational amplifier circuits A1 and A2 respectively. During the VOD level change, the on-resistances associated with transistors M4 and M5 move such that the source resistance of each leg is substantially equal to half of the termination resistance.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A differential driver circuit comprising:
   an output driver circuit, including:
      differential amplifier circuitry;
      a first variable resistance circuit that is coupled to the differential amplifier circuitry; and
      a second variable resistance circuit that is coupled to the differential amplifier circuitry; and
   a feedback circuit that is coupled to the first and second variable resistance circuits, wherein a source resistance of the output driver circuit appears to a load as substantially similar to a termination resistance of the load,
   wherein the feedback circuit includes a third variable resistance circuit,
   the third variable resistance circuit includes a replica of the first variable resistance circuit,
   the third variable resistance circuit is coupled to the first variable resistance circuit,
   the feedback circuit further includes a fourth variable resistance circuit,
   the fourth variable resistance circuit includes a replica of the second variable resistance circuit,
   the fourth variable resistance circuit is coupled to the second variable resistance circuit, and
   wherein the feedback circuit further includes:
      a transistor that is coupled between the third variable resistance circuit and the fourth variable resistance circuit;
      a first operational amplifier circuit that is coupled between the transistor and the third variable resistance circuit; and
      a second operational amplifier circuit that is coupled between the transistor and the fourth variable resistance circuit.

2. The differential driver circuit of claim 1, wherein the feedback circuit includes a scaled replica of a leg of the output driver circuit.

3. The differential driver circuit of claim 1, wherein the feedback circuit is configured to adjust the first variable resistance circuit and the second variable resistance circuit to track a change in the termination resistance, such that the source resistance tracks the change in the termination resistance.

4. The differential driver circuit of claim 1, wherein the differential amplifier circuitry includes:
   a first transistor that is coupled between the first variable resistance circuit and a first output node;
   a second transistor that is coupled between the first variable resistance circuit and a second output node;
   a third transistor that is coupled between the second variable resistance circuit and the first output node; and
   a fourth transistor that is coupled between the second variable resistance circuit and the second output node.

5. The differential driver circuit of claim 1, wherein the first variable resistance circuit includes a transistor having a drain that is coupled to the differential amplifier circuitry and a gate that is coupled to the feedback circuit.

6. The differential driver circuit of claim 5, wherein the feedback circuit is configured to adjust an on-resistance that is associated with the transistor.

7. The differential driver circuit of claim 5, wherein the first variable resistance circuit further includes a resistor that is coupled in parallel with the transistor.

8. The differential driver circuit of claim 5, wherein the second variable resistance circuit includes another transistor having a drain that is coupled to the differential amplifier circuitry and a gate that is coupled to the feedback circuit.

9. The differential driver circuit of claim 8, wherein the feedback circuit is configured to modulate the transistor and the other transistor.

10. The apparatus of claim 1, wherein the output driver circuit further includes a current source circuit that is coupled to the feedback circuit and the first variable resistance circuit.

11. The apparatus of claim 10, wherein the output driver circuit further includes a current sink circuit that is coupled to the feedback circuit and the second variable resistance circuit.

12. The apparatus of claim 1,
    wherein the first operational amplifier circuit is configured to adjust a resistance that is associated with the first variable resistance circuit and a resistance that is associated with the third variable resistance circuit, and
    wherein the second operational amplifier circuit is configured to adjust a resistance that is associated with the second variable resistance circuit and a resistance that is associated with the fourth variable resistance circuit.

13. The apparatus of claim 1,
    wherein the output driver circuit further includes a first current source circuit that is coupled to the first variable resistance circuit,
    the feedback circuit further includes:
       a replica resistor that is coupled in parallel with the transistor;
       a second current source circuit that is a replica of the first current source circuit; and
       a third operational amplifier circuit that is coupled to the first variable resistance circuit, the third variable resistance circuit, and the transistor, and
    wherein the third operational amplifier circuit is configured to adjust the transistor such that the first current source and the second current each provide an approximately constant current.

14. A differential driver circuit comprising:
    an output driver circuit including:
       differential amplifier circuitry that is configured to provide a differential output signal in response to a differential input signal;
       a first variable resistance circuit that is configured to vary a resistance that is associated with the first variable resistance circuit in response to a first control signal; and
    a second variable resistance circuit that is configured to vary a resistance that is associated with the second variable resistance circuit in response to a second control signal; and
    a feedback circuit that is configured to provide the first control signal and the second control signal, wherein a source resistance of the output driver circuit appears to a load as substantially similar to a termination resistance of the load,
    wherein the output driver circuit is further configured to provide a monitor signal,
    the feedback circuit includes:
       a third variable resistance circuit that is configured to vary a resistance that is associated with the third variable resistance circuit in response to the first control signal,
       wherein the third variable resistance circuit is a replica of the first variable resistance circuit;
       a fourth variable resistance circuit that is configured to vary a resistance that is associated with the fourth variable resistance circuit in response to the second control signal, wherein the fourth variable resistance circuit is a replica of the second variable resistance circuit;
       a transistor that is coupled between the third variable resistance circuit and the fourth variable resistance circuit;
       a first operational amplifier that is configured to provide the first control signal;
       a second operational amplifier that is configured to provide the second control signal; and
       a third operational amplifier circuit that is coupled to the first variable resistance circuit, the third variable resistance circuit, and the transistor wherein the third operational amplifier circuit is configured to modulate the transistor in response to the monitor signal such that the first current source circuit and the second current source circuit each provide approximately constant current,
    wherein the output driver circuit further includes:
       a first current source circuit that is coupled to the first variable resistance circuit and the feedback circuit; and
       a first current sink circuit that is coupled to the second variable resistance circuit and the feedback circuit,
    the feedback circuit further includes:
       a second current source circuit that is a replica of the first current source circuit;
       a second current sink circuit that is a replica of the first current sink circuit;
       a fourth operational amplifier circuit that is configured to bias the first and second current source circuits in response to a first upper reference signal and a first feedback signal; and
       a fifth operational amplifier circuit that is configured to bias the first and second current sink circuits in response to a first lower reference signal and a second feedback signal, the transistor is coupled between a first feedback node and a second feedback node, the first operational amplifier circuit is configured to provide the first control signal in response to a third feedback signal that is received at the first feedback node and a second upper reference signal, and wherein the second operational amplifier circuit is configured to provide the second control signal in response to a fourth feedback signal that is received at the second feedback node and a second lower reference signal.

15. A differential driver circuit, comprising:
an output driver circuit, including:
   differential amplifier circuitry;
   a first variable resistance circuit that is coupled to the differential amplifier circuitry; and
   a second variable resistance circuit that is coupled to the differential amplifier circuitry; and
a feedback circuit that is configured to control a resistance that is associated with the first variable resistance circuit and a resistance that is associated with the second variable resistance circuit such that a source resistance of the output driver circuit tracks the termination resistance,
wherein the output driver circuit further includes:
   a current source transistor that is arranged to provide a current responsive to a bias signal, wherein the current source transistor operates in a saturation region of operation or an active region of operation, the first variable resistance circuit is coupled between the current source circuit and the differential amplifier circuitry, and wherein the first variable resistance circuit is arranged to receive the current.

16. The differential driver circuit of claim 15, wherein the first variable resistance circuit includes:
   a transistor; and
   a resistive element that is coupled in parallel with the transistor.

17. The differential driver circuit of claim 15, wherein the first variable resistance circuit includes a transistor, the transistor includes a gate, and wherein the feedback circuit is arranged to control the resistance that is associated with the first variable resistance circuit by providing a first control signal to the gate of the transistor such that the transistor is biased in a linear region of operation.

18. The differential driver circuit of claim 17, wherein the second variable resistance circuit includes another transistor, the other transistor includes a gate, and wherein the feedback circuit is arranged to control the resistance that is associated with the second variable resistance circuit by providing a second control signal to the gate of the other transistor such that the other transistor is biased in the linear region of operation.

19. A differential driver circuit, comprising:
an output driver circuit, including:
   differential amplifier circuit;
   a first variable resistance circuit that is coupled to the differential amplifier circuitry; and
   a second variable resistance circuit that is coupled to the differential amplifier circuitry; and
a feedback circuit that is configured to control a resistance that is associated with the first variable resistance circuit and a resistance that is associated with the second variable resistance circuit such that a source resistance of the output driver circuit tacks the termination resistance, wherein
the feedback circuit includes:
   a third variable resistance circuit;
   a fourth variable resistance circuit;
   a transistor that is coupled between the third variable resistance circuit and the fourth variable resistance circuit;
   a first op amp circuit that is coupled between the transistor and the third variable resistance circuit; and
   a second op amp circuit that is coupled between the transistor and the fourth variable resistance circuit.

20. The differential driver circuit of claim 19, wherein the output driver circuit further includes:
   a current source transistor that is arranged to provide a current responsive to a bias signal, wherein the current source transistor operates in a saturation region of operation or an active region of operation, the first variable resistance circuit is coupled between the current source circuit and the differential amplifier circuitry, and wherein the first variable resistance circuit is arranged to receive the current.

* * * * *

UNITED STATES PATENT AND TRADEMARK OFFICE
CERTIFICATE OF CORRECTION

PATENT NO. : 7,071,739 B1 Page 1 of 1
APPLICATION NO. : 10/755011
DATED : July 4, 2006
INVENTOR(S) : Ivan Duzevik et al.

It is certified that error appears in the above-identified patent and that said Letters Patent is hereby corrected as shown below:

Column 3, Line 57, Delete "(lout)" and insert -- (Iout) --.
Column 4, Line 59, "lout" and insert -- Iout --.
Column 5, Line 28, Delete "Bias 1,Bias2" and insert -- Bias 1, Bias 2 --.
Column 5, Line 29, Delete "lout" and insert -- Iout --.
Column 8, Line 2, In Claim 14, after "circuit" insert -- , --.
Column 8, Line 43 (Approx.), In Claim 14, after "transistor" insert -- , --.
Column 10, Line 11, In Claim 19, delete "circuit;" and insert -- circuitry; --.
Column 10, Line 20 (Approx.) In Claim 19, delete "tacks" and insert -- tracks --.
Column 10, Line 29 (Approx.) In Claim 19, delete "op amp" and insert
-- operational amplifier --.
Column 10, Line 32 (Approx.) In Claim 19, delete In Claim 19, delete "op amp" and insert -- operational amplifier --.

Signed and Sealed this

Twelfth Day of December, 2006

JON W. DUDAS
*Director of the United States Patent and Trademark Office*